United States Patent [19]

Kluge-Weiss

[11] Patent Number: 4,519,850
[45] Date of Patent: May 28, 1985

[54] PROCESS FOR THE THERMO-MIGRATION OF LIQUID PHASES

[75] Inventor: Petra Kluge-Weiss, Birmenstorf, Switzerland

[73] Assignee: BBC Brown, Boveri & Company Limited, Baden, Switzerland

[21] Appl. No.: 524,327

[22] Filed: Aug. 18, 1983

[30] Foreign Application Priority Data

Aug. 24, 1982 [EP]  08241982 .................. 82201054

[51] Int. Cl.³ .......................................... H01L 21/225
[52] U.S. Cl. ........................................ 148/1.5; 29/574; 148/171; 148/172; 148/188
[58] Field of Search ................ 148/1.5, 171, 172, 188; 29/574

[56] References Cited

U.S. PATENT DOCUMENTS

| | | | |
|---|---|---|---|
| 2,813,048 | 11/1957 | Pfann | 148/1.5 X |
| 3,396,059 | 8/1968 | Giammanco | 148/171 |
| 3,484,302 | 12/1969 | Maeda et al. | 148/171 X |
| 3,897,277 | 7/1975 | Blumenfeld | 148/171 X |
| 3,977,910 | 8/1976 | Anthony et al. | 148/1.5 |
| 3,998,662 | 12/1976 | Anthony et al. | 148/171 X |
| 4,041,278 | 8/1977 | Boah | 148/171 X |
| 4,199,379 | 4/1980 | Mizrah | 148/171 X |
| 4,371,421 | 2/1983 | Fan et al. | 148/171 X |

*Primary Examiner*—G. Ozaki
*Attorney, Agent, or Firm*—Oblon, Fisher, Spivak, McClelland and Maier

[57] ABSTRACT

In a process for the thermo-migration of liquid phases in a temperature gradient, which process starts from a metal coating (2) on a semiconducting substrate (1), the metal coating (2) is applied to a plane substrate surface (11), the temperature gradient is produced, in vacuo, by means of two flat faces (5, 6), which are parallel and can be heated uniformly, and is reversed by lowering the temperature of the warmer face and, at the same time, raising the temperature of the cooler face. The smooth temperature distribution leads to a reduction in the number of process steps, while at the same time yielding good results.

11 Claims, 4 Drawing Figures

PROCESS FOR THE THERMO-MIGRATION OF LIQUID PHASES

The invention relates to a process for the thermomigration of liquid phases, as well as to an apparatus for carrying out the process.

A process of this type is known from the published U.S. Pat. No. 3,977,910. Starting from a semiconducting substrate possessing at least one plane surface, patterns of indentations are produced, on this surface, by means of a photolithographic etching process and, in a subsequent vapour-deposition process, are filled with a suitable metal. The substrate prepared in this manner, is heated under a protective atmosphere composed of a gas which conducts heat effectively, in a temperature gradient, to temperature levels such that the metal which has been deposited forms, with simultaneous surface-melting of the semiconducting material, a molten zone comprising a liquid phase, this molten zone migrating through the semiconducting substrate, in the direction counter to the temperature gradient which is imposed, and leaving behind, as a trace, a solid alloyed zone which is at the same time to be regarded as the doping zone in the semiconductor.

The molten zone can either migrate completely through the substrate, and thus produce a doping zone which extends completely through it, or can, by reversing the temperature gradient, be forced to turn back at a finite depth, so that a doping zone forms, in the semiconducting substrate, extending as far as a finite depth.

The reversal of the temperature gradient, relative to the substrate, can be brought about, in principle, either by altering the position of the substrate, that is to say, for example, by turning the substrate round in the gradient, or by causing the gradient to change direction itself. The second possible method avoids the use of mechanical devices for manipulating the substrate position, if the gradient is produced by means of a pair of oppositely-positioned tungsten resistance heaters, and is influenced, by electrical means, through the heat output of the individual resistance heaters.

However, achieving an electrically controlled reversal of the gradient, by means of the known method, creates problems, since, on the one hand, instability effects occur as a result of thermal convection in the gas atmosphere which is used during the entire migration process, manifesting themselves as additional radial temperature gradients, and since, on the other hand, the two gradient directions are not equivalent because the convection is superposed additively on the gradient in one case, but is superposed subtractively in the other case.

Furthermore, several process steps are necessary, in the case of the method which has been described, prior to the migration, in order to deposit the metal in the indentations on the substrate, because the uniformity of the temperature distribution, as produced by the tungstenwire resistance heaters, is insufficient to guarantee perfect migration from the substrate surface and, in particular, the melt on the surface is unstable and tends to form drops.

In addition, there is the danger that, during the reversal of the temperature gradient, the molten zone in the semiconducting substrate will, for a time, solidify, which would lead to deformations and, as a possible result, mechanical damage to the substrate.

The object underlying the present invention is accordingly to provide a process for thermo-migration, this process yielding an improvement in the quality of the doping structures produced by the process, accompanied by a reduction in the number of process steps which are necessary.

In the case of a process of this generic type, the object is achieved when certain features described hereinafter are implemented. In a preferred illustrative embodiment of the process according to the invention, the metal coating is produced by means of a vapour-deposition operation, followed by a photolithographic texturing treatment. In the apparatus, according to the invention, for carrying out the process, the resistance heaters are composed of pyrolysed electro-graphite, the faces which can be heated preferably being identical with the surfaces of the resistance heaters.

In the text which follows both the process according to the invention and the apparatus for carrying out the process are described and explained by reference to illustrative embodiments which are represented in the drawing, in which.

Figure 1:
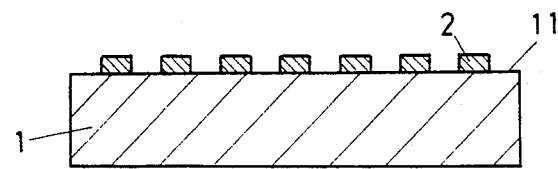
FIG. 1 shows a substrate, which has been prepared for the migration treatment, on which a metal coating has been applied.

In the thermo-migration process, the starting point is a semiconducting substrate which is composed, for example, of silicon, and is customarily in the form of a single crystal, the axes of which exhibit a preferred orientation. For the manufacture of diodes possessing deep P-N junctions, a pre-doped semiconducting material is advantageously used, of one conductivity-type and possessing a defined resistivity. In the majority of cases, the substrate takes the form of a flat wafer, sawn from a cylinder. Prior to the migration, the surfaces are ground, polished and cleaned by known methods. As represented, in the finished form, in FIG. 1, a metal coating 2 is applied to one plane surface 11 of the semiconducting substrate 1, pretreated in the abovementioned manner. If the substrate material in question is N-doped silicon, the metal coating 2 can be composed, for example, of aluminium.

Figure 2:
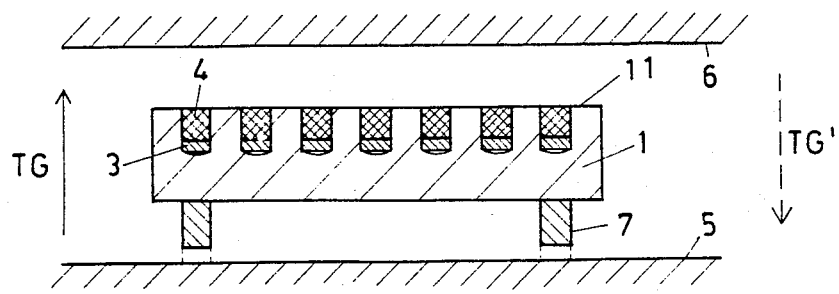
FIG. 2 shows a substrate during the migration treatment in the temperature gradient.

The coated semiconducting substrate is placed, according to FIG. 2, in a temperature gradient TG in a vacuum apparatus, this temperature gradient being produced by means of two flat faces, 5 and 6, which are arranged so that they are parallel, which can be heated uniformly and which are at different temperatures. The direction of the temperature gradient TG, indicated by the arrow in FIG. 2, is obtained by arranging for the temperature of the lower flat face 5 to be higher than that of the upper flat face 6. Correspondingly reversed conditions result in the case of the direction of the temperature gradient TG', which is drawn with a broken line.

First of all, the semiconducting substrate 1 is heated up, in a protective gas atmosphere, in order to reduce the surface tension of the melt which forms, and thus to avoid the formation of drops. The protective gas atmosphere is, in an advantageous manner, composed of $N_2$, at a pressure of 400–600 mm Hg. Shortly after reaching the migration temperature, and as the migration starts, the N₂ atmosphere is pumped off.

Since, during the migration, the arrangement according to FIG. 2 is operated under vacuum conditions, exchange of thermal energy, between the flat faces 5 and 6, and the semiconducting substrate 1, takes place by thermal radiation alone. As a result of this radiation exchange, a temperature gradient is established in the semiconducting substrate, this temperature gradient being a function of the temperatures of the flat faces 5 and 6, and of the emission and absorption characteristics of all the surfaces involved in the exchange of radiation. As a result, an extraordinarily smooth temperature distribution is produced, which is adversely affected neither by convection phenomena, nor by inadequate transmission between two bodies.

The range of temperatures occurring in the semiconducting substrate 1 is selected in a manner such that it lies below the melting point of the semiconducting material which is used, but lies above the melting point of the metal which has been applied, the latter melting point being the lower. In the case of the silicon-/aluminium system, which exhibits melting points ranging from 1417° C. and 658° C., the substrate is, for example, brought to a mean temperature of 1200° C., while the temperature gradient TG can amount to between 50° C./cm and 200° C./cm.

During the heating step, a molten zone 3 forms, as soon as the melting point of the metal in the metal coating 2 is reached, this molten zone commencing to alloy with the semiconducting material of the substrate, at the contact face 11, and producing, in this manner, a liquid metal/semiconductor alloy. The molten zone 3 migrates, in a known manner, in the direction opposite to that of the temperature gradient TG which is imposed, and leaves behind, as the trace of this migration, a solid alloyed zone 4.

When the molten zone 3 has reached a predetermined depth in the semiconducting substrate 1, this depth being governed inter alia, by the magnitude of the prevailing temperature gradient and the duration of the migration treatment, the direction of the temperature gradient is reversed, by appropriate control of the temperature at the flat faces 5 and 6, so that a new gradient TG' is established.

To achieve this, the temperature of the warmer flat face 5 is lowered and, at the same time, the temperature of the cooler flat face 6 is raised. From this, there results the advantage that the mean temperature in the substrate can be kept high enough, during the reversal operation, to prevent, in a reliable manner, the molten zone 3 from solidifying for a time, and thereby to prevent the occurrence of thermomechanical stresses in the semiconducting crystal, which accompany such solidification.

As a result of the special manner in which the process is carried out, process steps for producing partial indentations, for example by lightly etching the substrate surface, into which indentations the metal is introduced, thus presetting a preferred direction from the outset of the migration, become superfluous. This special manner includes (1) reduction of the surface tension during the heating-up step, which is performed in a protective gas atmosphere, and (2) the smoothness of the temperature distribution during the migration, which takes place in vacuo. The latter characteristics can also be described as the constancy of the direction of the temperature gradient, which is produced by the flat faces 5 and 6, which are arranged so that they are parallel and which can be heated uniformly. As a result, of these special characteristics the metal coating 2 is applied directly to a plane, non-textured surface.

According to one embodiment of the process, the termination of the migration, when the molten zone 3 has migrated from within the semiconducting substrate 1, back to the substrate surface 11, under the action of the reversed temperature gradient, is followed by the removal, by evaporation, of residues of the metal, from the substrate surface, this operation being carried out at an elevated temperature, that is to say the metal is evaporated from the liquid phase. This has the special advantage, compared to the state of the art, that the conventional material-removing operation involving the mechanical or chemical removal, following termination of the migration, of a surface layer possessing a defined thickness, and containing the solidified metal-rich phase which formed the original molten zone, can be dispensed with.

In accordance with a further embodiment of the process according to the present invention, the metal coating 2 is produced by means of a known vapour-deposition process, followed by a photolithographic texturing treatment. Thus, vapour-deposited lines, composed of aluminium, 40 μm wide and 1.4 mm long, have been successfully used for the migration process, these lines exhibiting, in particular, a coating thickness of 3 μm.

It is particularly advantageous to maintain, during the migration treatment, a vacuum better than $1 \times 10^{-5}$ mm Hg in the apparatus employed for this purpose, because this ensures, on the one hand, that the formation of the temperature gradients, TG and TG' is unaffected by convection phenomena and, on the other hand, that the contamination of the substrate by foreign atoms remains slight.

Besides the convection phenomena which have already been mentioned, it is also possible for the smoothness of the temperature distribution to be adversely affected by uncontrolled heat conduction via contact surfaces between the substrate 11 and the flat faces, 5 and 6, which can be heated. It is accordingly advantageous that the heat transport between the semiconducting substrate and the flat faces should take place through radiation alone.

In particular, it has proved advantageous to maintain a clearance of 5–15 mm between the semiconducting substrate 11 and the flat faces, 5 and 6, which can be heated, this being effected by means of quartz spacers 7, in order to obtain geometrical conditions which are suitable with regard to the radiation exchange. In order to avoid direct thermal conduction, the spacers 7 are advantageously designed in a manner such that they do not touch the flat face 5 which can be heated. Correspondingly, in order to avoid edge effects, the flat faces which can be heated should be considerably larger than the oppositely-located surfaces of the semiconducting substrate. In this way, it is possible to expect homogeneous temperature conditions in a $30 \times 30$ mm² region when flat faces, which can be heated, and which measure $70 \times 70$ mm, are used.

A mean substrate temperature which is suitable for the migration is obtained when the temperature of that flat face which, at any particular time, is the warmer, that is to say, in the case of the temperature gradient TG, the temperature of the face 5, is kept at approximately 1540° C. during the migration. The magnitude of the gradient can then be adjusted by adjusting the temperature of the other flat face. Overall, it is possible, by means of the two flat faces, to adjust both the mean substrate temperature and the gradient to predetermined values, independently of one another.

In order to obtain a suitable actual value, as the starting point for controlling the flat faces which can be heated, it is advantageous, furthermore, to measure and to monitor the temperature, by means of a pyrometric technique employing a photodiode which responds to radiation over a wavelength range extending from 0.7 to 1.1 μm. This results, in particular, in the temperature measurement being rapid, and without physical contact, and in the radiation conditions in the migration apparatus being taken into account.

During the reversal of the temperature gradient TG, to become the gradient TG', solidification of the molten zone 3, resulting from the raising of the temperature of the cooler flat face which can be heated simultaneously with the lowering of the temperature of the warmer flat face which can be heated, is avoided. Solidification is prevented particularly reliably when, during the reversal of the temperature gradient, the lower of the temperatures of the two flat faces, 5 and 6, which can be heated, is kept above the solidification temperature of the liquid phase in the molten zone 3.

Figure 3:
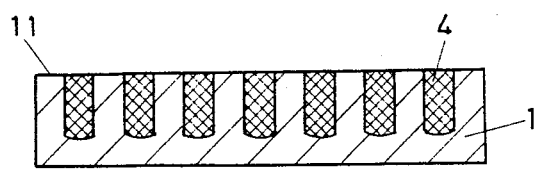
FIG. 3 shows a substrate with a doping structure, produced by the process according to the invention.

A semiconducting substrate exhibiting a doping structure, composed of alloyed zones 4, manufactured by the process according to the invention, is represented in FIG. 3.

Figure 4:
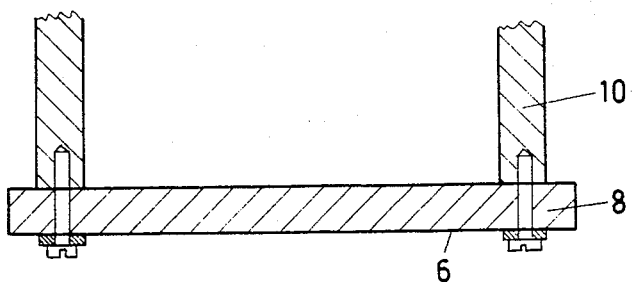
FIG. 4 shows an illustrative embodiment of the apparatus for carrying out the process according to the invention.
Figure 4:
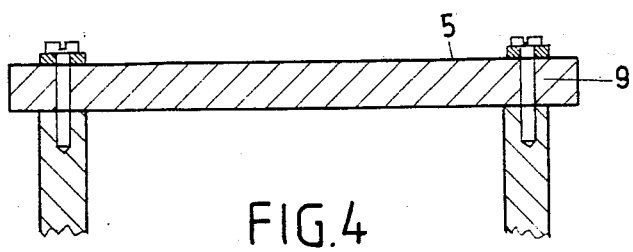

FIG. 4 shows an apparatus for carrying out the process, in which apparatus the resistance heaters, 8 and 9, used to heat the flat faces, 5 and 6, which can be heated, are composed of pyrolysed electro-graphite, and accordingly exhibit uniformly good radiation emission, in association with a favourable electrical resistance and high stability at elevated temperatures. The resistance heaters are designed, for example, in the form of plates possessing a thickness of approximately 6 mm, and are connected to an efficient and controllable source of electrical power, via current-supply elements 10 which, for electrical and thermal reasons, are composed of copper.

According to a particularly simple embodiment of the apparatus, the flat faces, 5 and 6, which can be heated, are directly identical with corresponding surfaces of the resistance heaters 8 and 9.

In a further embodiment, the plates forming the resistance heaters 8 and 9 are slotted in order to increase the electrical resistance. If these slots have a width of approximately 2 mm, and are arranged 10 mm apart, the tests which have been carried out indicate that there are no resulting influences, of a disadvantageous nature, on the smoothness of the temperature distribution, when the clearance between the substrate and the heater is adequate, amounting to approximately 15 mm.

On the other hand, the resistance heaters 8 and 9 can be composed of a graphite sheet, approximately 0.2 mm thick, on which a graphite plate is placed in order to homogenise the radiation field, so that the heaters and the flat faces which can be heated are designed as separate parts, and can be optimised independently of one another.

Overall, the process according to the invention is distinguished by great simplicity and reliability, accompanied, at the same time, by good results in terms of the doping structures which are produced, and this process can accordingly be employed, very economically, in particular in the mass-production of semiconductor elements, the functioning and operating behaviour of which depend on the presence of "deep" P-N junctions. Semiconductor elements of the type known under the name "gridistors" may be mentioned as an example.

I claim:

1. A process for the thermo-migration of liquid phases comprising the steps of:
    covering at least partially a plane surface of a semiconducting substrate with a layer of metal, the melting point of said metal being substantially lower than the melting point of said semiconducting substrate;
    forming a molten zone from said metal and the material of said semiconducting substrate at a temperature lying between said two melting points, and in an inert gas atmosphere;
    pumping off said inert gas atmosphere after said formation of said molten zone;
    establishing a first thermal gradient essentially perpendicular to said plane surface of said semiconducting substrate by means of two flat, parallel and uniformly heated faces;
    migrating said molten zone into said semiconducting substrate under vacuum conditions until it reaches a predetermined depth;
    establishing a second thermal gradient which is parallel to said first thermal gradient and has an opposite direction by lowering the temperature of the warmer of said two faces and raising the temperature of the cooler of said two faces; and
    migrating said molten zone from said predetermined depth back to said plane surface of said semiconducting substrate under vacuum conditions.

2. A process according to claim 1, wherein said semiconducting substrate is a silicon substrate and wherein said metal is aluminum.

3. A process according to claim 2, further comprising the step of:
    evaporating the remaining metal from said plane surface of said semiconducting substrate at an elevated temperature after said molten zone has been migrated back to said plane surface of said semiconducting substrate.

4. A process according to claim 2, further comprising the steps of:
    depositing said aluminum metal layer by means of vapor deposition with a thickness of approximately 3 μm and
    forming a predetermined pattern from said deposited metal layer by means of a photolithographic treatment.

5. A process according to claim 2, wherein said inert gas atmosphere is a nitrogen atmosphere with a pressure of 400–600 mm Hg, wherein the vacuum conditions comprise a pressure lower than $1 \times 10^{-5}$ mm Hg, and wherein heat transport between said flat faces and said semiconducting substrate is solely effected by thermal radiation.

6. A process according to claim 5, wherein a clearance of 5–15 mm is maintained between said semiconducting substrate and said flat faces by means of quartz spacers.

7. A process according to claim 2, further comprising the steps of:
    measuring and monitoring the temperatures in a pyrometric technique by means of a photodiode and maintaining the temperature of the warmer of said two faces at approximately 1540° C. during said migration steps.

8. A process according to claim 1, further comprising the step of:
   maintaining the temperature of the cooler of said two flat faces above the solidification temperature of said molten zone between said two migration steps.

9. A process according to claim 1, wherein said flat heated faces are surfaces of respective resistance heaters which are composed of pyrolyzed electrographite and designed in the form of slotted plates with a thickness of approximately 6 mm, said slotted plates being connected to a power supply by copper leads.

10. A process according to claim 1, wherein said flat heated faces are surfaces of respective graphite plates placed on resistance heaters which are composed of a sheet of graphite with a thickness of approximately 0.2 mm.

11. A process for thermo-migrating a doping metal into a semiconducting substrate, said process comprising the steps of:
   (a) at least partially covering a plane surface of a semiconducting substrate with a metal which, when heated, forms a solid alloy doping zone with the semiconductor substrate, the melting point of said metal being substantially lower than the melting point of said semiconductor substrate;
   (b) placing said semiconductor substrate in a space between two flat, parallel faces such that the plane surface of said semiconductor substrate is parallel to said two flat, parallel faces;
   (c) introducing an inert gas atmosphere into the space between said two flat, parallel faces;
   (d) heating said two flat, parallel faces to different temperatures, thereby creating a first temperature gradient which is perpendicular to the plane surface of said semiconductor substrate between said two flat, parallel faces, the temperature of said two flat, parallel faces being chosen such that said metal begins to melt, forming a molten zone which starts to migrate into said semiconductor substrate;
   (e) shortly after said molten zone has begun to migrate into said semiconductor substrate, pumping out the inert atmosphere in the space between said two flat, parallel faces, thereby subjecting said semiconductor substrate to a vacuum; then
   (f) allowing said molten zone to migrate into said semiconductor substrate under vacuum conditions until it reaches a predetermined depth; then
   (g) establishing a second thermal gradient between said two flat, parallel faces which is parallel to the first thermal gradient but which has an opposite direction by lowering the temperature of the warmer of said two flat, parallel faces and raising the temperature of the cooler of said two flat, parallel faces; and then
   (h) allowing said molten zone to migrate from said predetermined depth back to the plane surface of said semiconductor substrate.

* * * * *